Sept. 7, 1965 W. B. PICK ETAL 3,205,406

ELECTRIC COMPONENT HOLDER

Filed Dec. 15, 1961 4 Sheets-Sheet 1

INVENTORS
WILLIAM B. PICK
RONALD C. GILLIS

BY L. Lee Humphries

ATTORNEY

ELECTRIC COMPONENT HOLDER

Filed Dec. 15, 1961 4 Sheets-Sheet 2

INVENTORS
WILLIAM B. PICK
RONALD C. GILLIS
BY
L. Lee Humphries
ATTORNEY

INVENTORS
WILLIAM B. PICK
RONALD C. GILLIS
BY L. Lee Humphries
ATTORNEY

ELECTRIC COMPONENT HOLDER

Filed Dec. 15, 1961 4 Sheets-Sheet 4

INVENTORS
WILLIAM B. PICK
RONALD C. GILLIS
BY
L. Lee Humphries
ATTORNEY 3,205,406
ELECTRIC COMPONENT HOLDER
William B. Pick and Ronald C. Gillis, Downey, Calif., assignors to North American Aviation, Inc.
Filed Dec. 15, 1961, Ser. No. 159,689
3 Claims. (Cl. 317—99)

This invention relates to an electronic component holder and more particularly relates to an invention providing improved means for economically and readily holding electrical components, or electrical networks, for shipping, storing, testing, or otherwise handling.

Extensive use of electrical components, or electrical devices, requires that such components be handled in large quantities. In addition, inasmuch as complex electronic systems must, nevertheless, be extremely reliable, it is necessary that such electrical components be highly reliable. In order to determine reliability of electrical components, considerable additional handling is involved. That is, the components often must be "burned in" in order to achieve a maximum or optimum stability point in their useful lives. In addition, the components must be tested in order to determine their characteristics or, in other situations, their weaknesses.

The successful prediction of the lifetime and changes during that lifetime, of electrical components are based upon the statistical evaluation of components to learn the factors influencing it. Every variable adds to the uncertainty of performance or prediction. The factors of handling, packaging, shipping, testing, and storing all may cause undesired variations in the component.

A component carrier, or holder, therefore, provides a device to receive the component at the time of fabrication and retain it throughout transporting, aging, and testing. Simplicity of construction is achieved by utilizing the electrode connections for holding the components in the carrier. Extensive handling of components is presently accomplished by cumbersome techniques and such techniques do not provide a ready means of analysis nor of progressive continuity of tests on large quantities of components.

The device of the invention was conceived in order to permit handling of such electrical components in groups rather than individually. Therefore, the holder of the invention is adapted to receive a plurality of electrical components and hold such electrical components in a manner to allow effective, rapid test. In addition, the device of the invention is adapted to receive such components in rapid loading and to permit rapid unloading. At the same time, despite the ease of loading and unloading, secure electrical connection is retained between loading and unloading.

The device of the invention further permits adaptation to mechanized selection of electrical components for test as well as mechanized loading, unloading, or transportation.

In the handling of components, damage will often occur to the leads. The device of the invention permits component leads to be bent once and require no further bending, handling, or crimping in order to handle the component, test it, "burn" it in, or utilize it for other purposes.

It is therefore an object of the invention to provide a component holder of improved design.

Another object of the invention is to provide an electrical component holder making electrical connection with the component being held.

Still another object of the invention is to provide a substantially rigid component holder, holding electrical components in fixed, spaced relationship.

Another object of the invention is to provide an improved electronic component holder capable of holding electronic components securely.

A still further object of the invention is to provide an electronic component holder making a plurality of connections to each of the electrical connections of an electrical component.

Yet another object of the invention is to provide an electronic component holder permitting simultaneous loading and unloading of a plurality of electronic components.

A final object of the invention is to provide an electronic component holder providing ready external connection to the components being held.

Further objects and features of the invention will become apparent from the following description and drawings which are utilized for illustration purposes only.

Figures 1, 3, 4:
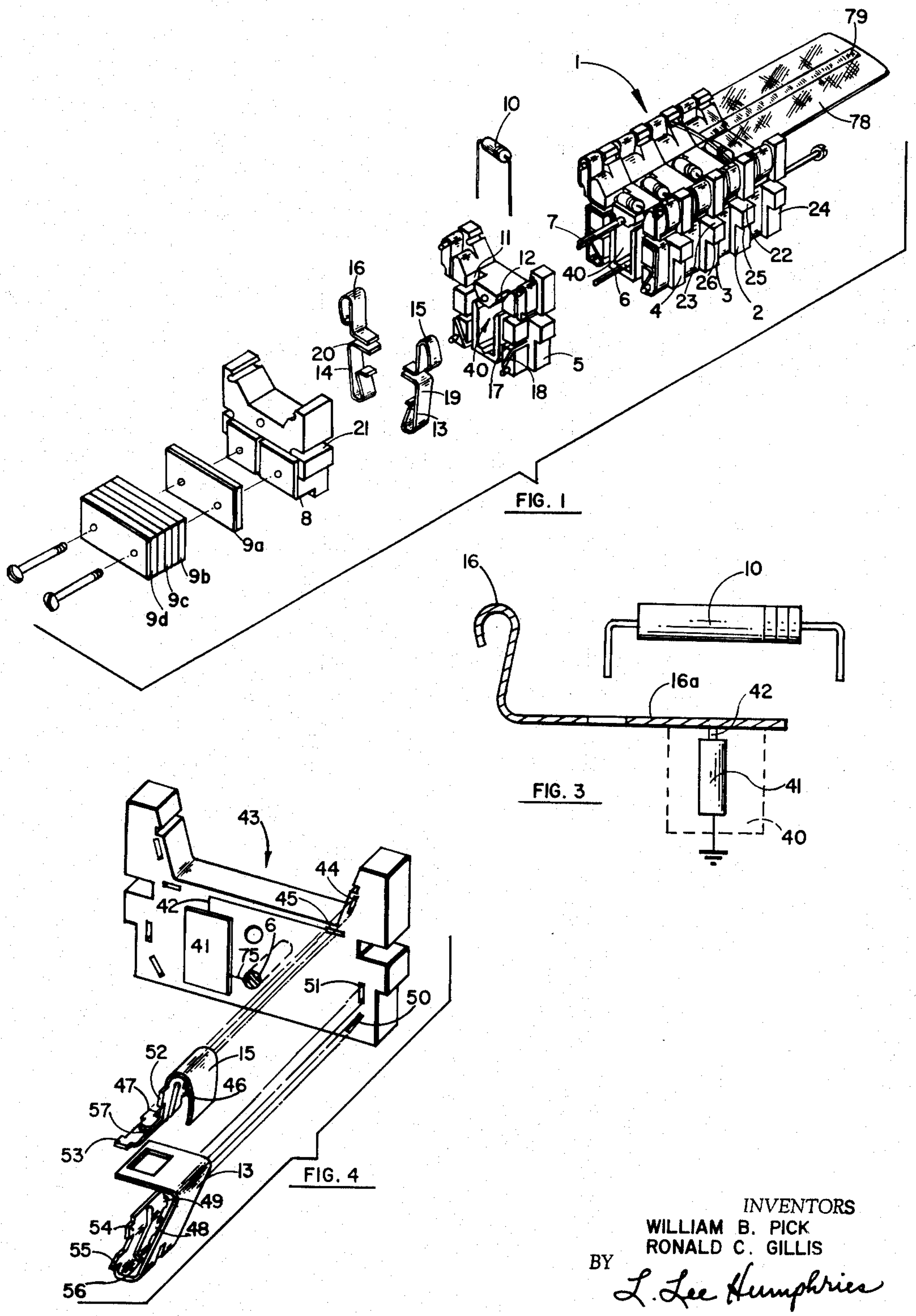
FIG. 1 is an exploded view of the component holder illustrating the several wafer-like elements comprising the body portion.
FIG. 3 is an illustration of one embodiment of the invention allowing additional components to be connected to the held component.
FIG. 4 is an alternate embodiment illustrating the holding of electrodes, or springs, between the wafer-like elements forming the body portion.

Referring to FIG. 1, there is shown a component holder illustrating the invention. It may be seen that the body portion 1 is comprised of a plurality of wafer-like elements, such as 2, 3, 4, and 5, which are then bound together by means such as pins or rods 6 and 7. Such pins or other binding structure may provide a certain amount of electromagnetic or electric field shielding. The wafer-like elements may be modified in design such as shown at 8 for the end locations and may include portions *9a*, *9b*, *9c*, and *9d* for identification (visually, magnetically, or otherwise) of the holder. An electrical component illustrated at 10 is adapted to be received by an element such as 5 and thus a series of such components are held along the body portion of the holder. The electrical components are thus held in a linear, substantially fixed relationship.

The element 5 includes open areas 11 and 12 for receiving the electrical connections to the component 10. Such electrical connections extend downwardly into the element 5 where electrical contact is made thereto by means of electrodes 13 and 14 (which may be springs) as well as 15 and 16. The electrode pairs are, of course, held in fixed relationship by means of element 5 or, in an alternate form, held in place by element 5 and its next succeeding element.

In the illustration shown in FIG. 1, element 5 is molded to receive and hold the spring elements 13 and 14. Slot 17 and slot 18 act to hold spring 13, and similar slots act to hold spring 14. Springs 13 and 14 thus may be flexed inwardly by pressure at points 19 and 20 on such spring elements. Such spring action is utilized to allow ready loading and unloading of the electrical components. Consequently, the surfaces such as 19 and 20 should be located so as to be actuable.

It may be thus noted, from FIG. 1 that, if desired, any given plurality, or even all, of the springs may be flexed at one time permitting removal of any number of the components.

In the illustration shown in FIG. 1, there is included notches such as at 21, 22, and 23, in each of the elements 8, 2, and 3, which permit loading on a track for automatic transportation or automatic indexing. Also included at 8*a* is a shoulder, or some means, for allowing indexing, or feeding, the component holder through automatic conveying means. Such shoulder in cooperation with a toothed wheel, or gear, or ratchet, for example, would operate to correctly position or drive the component holder.

Cover 78, which may be made of transparent material, may also include a magnetic strip 79 upon which may be recorded information pertaining to the component located underneath the cover. The information, for example, could indicate the electrical value of the component (e.g., if a resistor, its resistanre would be indicated).

There are also constructed, as at 24, 25, and 26, shoulders which permit the component holder to be rested in trays or on suitably designed equipment.

Figure 2:
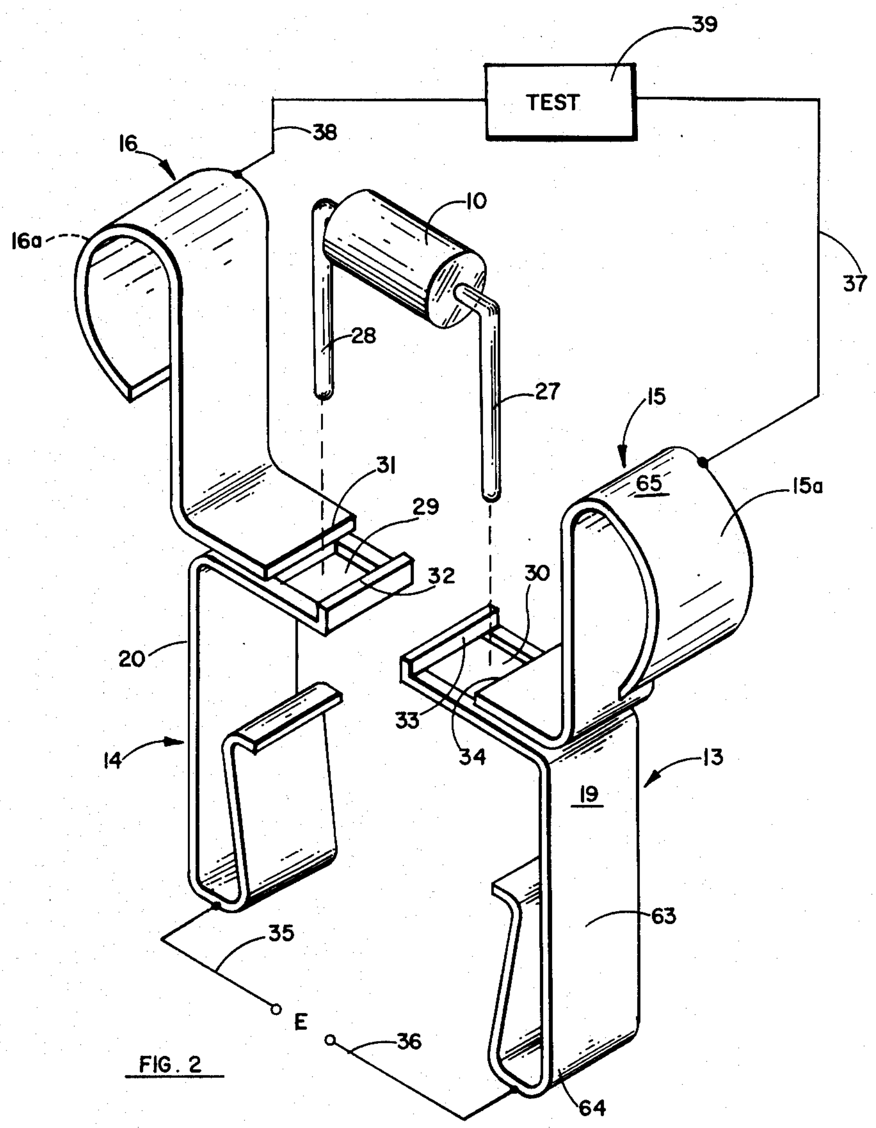
FIG. 2 is an illustration of the spring clips in one embodiment, for receiving and holding the electrical connections of an electrical component or network.

Referring to FIG. 2, it may be readily seen how component 10 together with its electrical connections 27 and 28 are received and retained by springs 13, 14, 15, and 16. As surfaces 19 and 20 are flexed inwardly, toward each other, as shown in FIG. 2, open portions 29 and 30 are revealed providing spaces for the electrical wires 27 and 28 to be received. As the springs 13 and 14 are released, the wires 27 and 28 are then firmly held between edge portion 31 of spring 16 and edge portion 32 of spring 14 as well as between edge 33 of spring 13 and edge 34 of spring 15.

It may be appreciated from the electrical connections illustrated at 35 and 36 that electrical current may be provided to the component under test. At the same time by means of the electrical connections illustrated at 37 and 38, a test instrument 39 may be used to effectively determine the characteristics, or weaknesses, of component 10 without being influenced by the contact resistance between edges 32 and 33 and wires 27 and 28, through which considerable electrical current may be flowing or across which significant electrical voltage drop may appear. The test circuit, therefore, is somewhat isolated from the energization circuit, not being subject to the voltage drops inherent in the energization circuit. The energizing and test circuits may, of course, be transposed with respect to each other.

Figure 5:
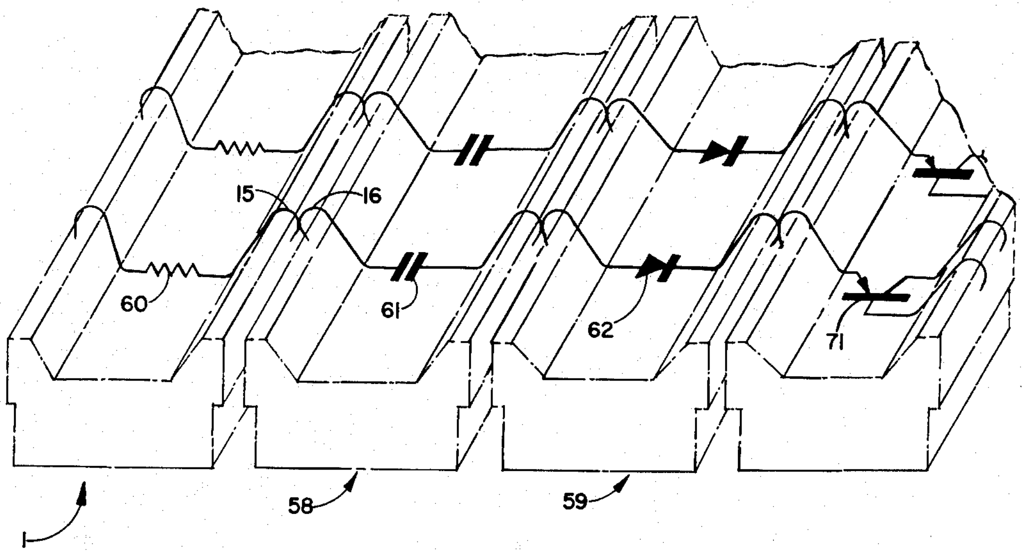
FIG. 5 is an illustration of side by side disposition of such component holders, to make electrical contact therebetween.

Referring to FIGS. 1 and 2, it may be seen that electrodes 15 and 16 may be constructed to include a spring portion 15*a* and 16*a* to permit electrical contact with pressure members included on other equipment. In addition, such construction enables ready contact between adjacent parallel component holders, surface 15*a*, for example, abutting and contacting surface similar to that shown at 16*a* on an adjacent component holder, such as shown in FIG. 5.

It may be appreciated that a jig may be readily devised for actuating all springs within a component holder simultaneously or otherwise in order to permit loading or unloading of the electrical components. The electrodes are thus easily disengaged from the component. In addition, an electrical connection jig may be devised to provide ready electrical connection to each of the electrodes similar to those illustrated at 13, 14, 15, and 16.

It may be seen with reference to FIG. 1 that at location 40 an additional electrical element may be disposed. FIG. 3 shows such location 40 (dotted lines) and electrical component 41 is shown as disposed therein. In this illustration, for example, spring 16 is extended at 16*a* and electrical connection is made to component 41 by means of wire 42. The remaining side of component 41 may be connected to ground or to a common signal connection. In this manner component 10 may be connected in series with a current limiting resistor, a capacitor, an inductor, or other electrical component designed, for example, to test component 10 or to protect component 10 or for other reasons. One novel concept lies, therefore, in providing specific location for individual electrical components to be included in electrical circuit with the component being held by the component holder. FIG. 4 illustrates how much component 41 may be a thin film or a wafer disposed on the wafer-like element 43. One connection 42 is made to spring 15, for example, at protrusion 46 (where it enters the wafer 43) and another contact, such as to ground (or a common return) is made by connection 75 to rod 6. Such wafer or thin film may be comprised of one or several electrical components such as resistors, capacitors, diodes, or even other components.

FIG. 4 illustrates an alternate embodiment of the device in which a wafer-like element 43 is constructed as an alternate to those wafers 2, 3, and 4 in FIG. 1.

In the use of such an embodiment the spring clips are held between adjacent wafers rather than being held or restrained by a single wafer. Slots 44 and 45 are adapted to receive and hold protrusions 46 and 47 on spring 15, and protrusions 48 and 49 extend into slots 50 and 51, respectively, on element 43. The next successive wafer element has similar slots located therein to receive protrusions 52 and 53 and 54 and 55. Thus the spring elements 13 and 15 as well as elements such as 14 and 16 in FIGS. 1 and 2 are incorporated between successive insulative or spacing wafers.

Such structure is particularly adapted to be made of high-temperature material. Wafer element 43 and the additional corresponding wafers may be made of a high-temperature ceramic. Electrodes such as 13, 14, 15, and 16 may, of course, be made of stainless steel, whereas, on the contrary, in the previous embodiments beryllium copper possibly could have been used.

Slots in the electrodes such as those shown at 56 and 57 will provide a certain amount of flexibility and prevent the component holder from being too rigid.

It may be realized that with such building blocks as shown in either FIGS. 1 or 4 the elements may be assembled into component holders of any desired length and adjusted to hold components of widely varying characteristics.

As illustrated in FIG. 5, it may be appreciated that component holders 1, 58 and 59 may be aligned longitudinally along side each other, and for particular tests the components in one carrier being utilized in series connection with the components in the adjacent component holder. Thus a resistor 60 may be connected in series with a capacitor 61 and a diode 62 merely by adjacently locating the component holders. Such relative use of component holders is of advantage in "burning in" electrical components in order to take such components to the optimum point in their useful life. While surfaces such as 15*a*, FIG. 2, are utilized in making such connections, other connections are possible between adjacent holders such as using adjacent surfaces similar to those shown at 63, 64, or 65, FIG. 2. Several of the embodiments shown in FIG. 6 may be placed adjacent to each other and from FIG. 7 it may be seen that electrical contact may still be effected therebetween.

Figure 7:
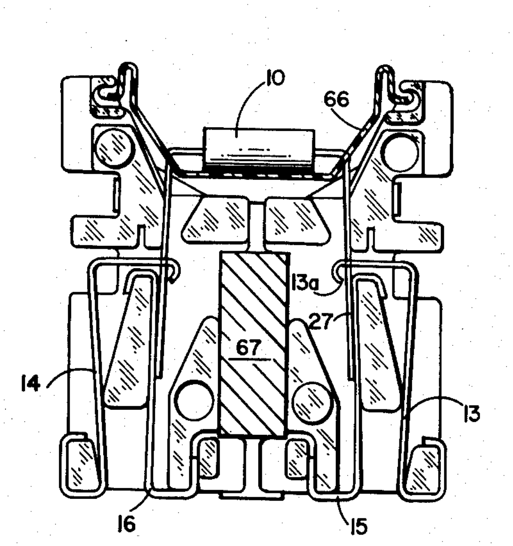
FIG. 7 is an end view of the electrodes held by a wafer-like element.
Figure 6:
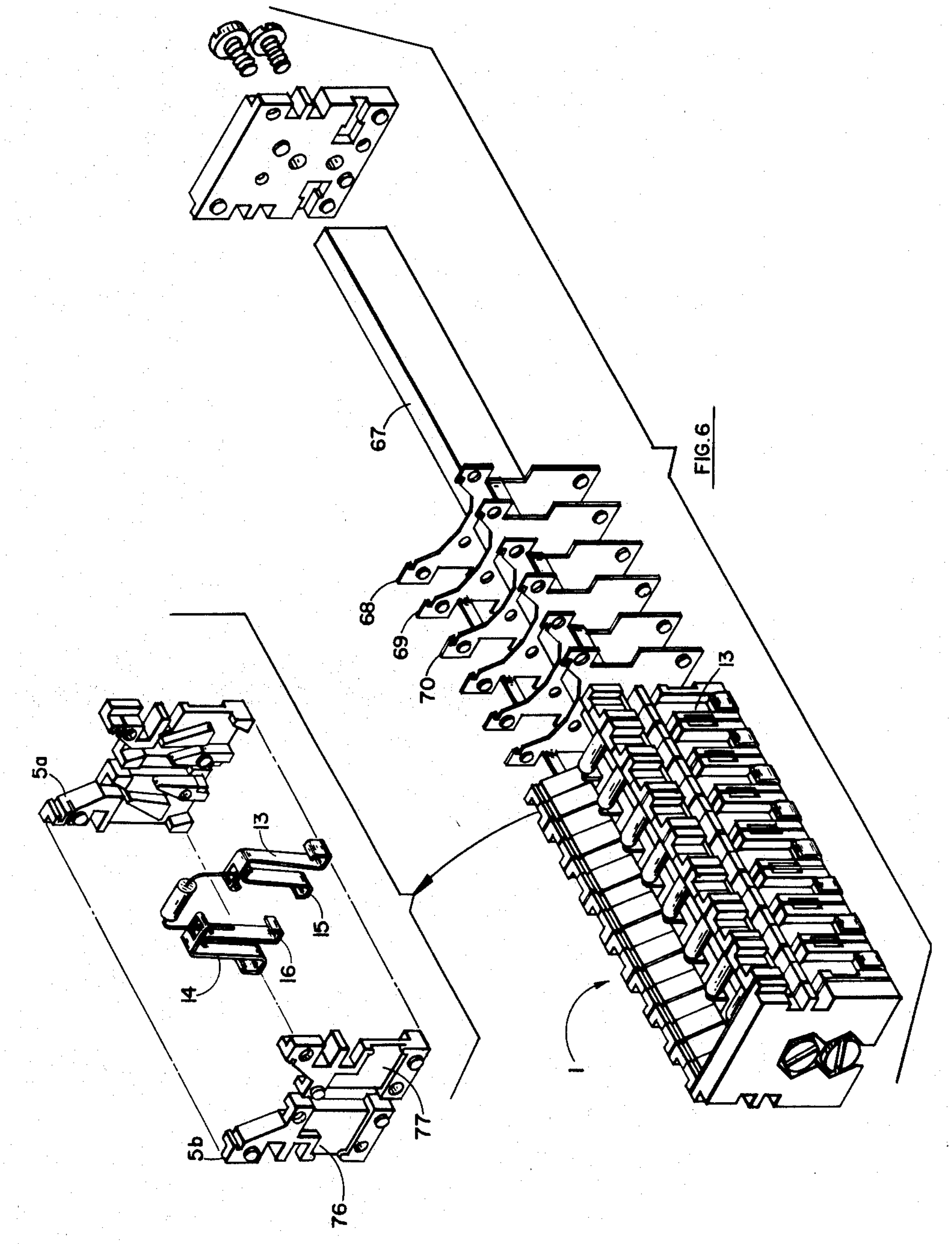
FIG. 6 is an alternate embodiment showing modified electrode disposition as well as providing a shield between successive components.

Other methods of spring retaining such components are feasible within the concept of the invention. Such an illustration is shown in FIG. 6, wherein two wafer-like elements 5*a* and 5*b* space each set of electrodes such as 13 through 16. It is noted that electrodes 15 and 16 extend to the lower portion of the component holder and are accessible from the bottom of the holder. FIG. 7 more clearly illustrates how the electrodes are retained and how one set of electrodes, 13, 14, 15, and 16, are retained thereby. In this embodiment it is noted that a corner of the end portion 13*a* of spring 13 "bites" into wire 27 of the component under test. A plastic liner 66, extending under component 10, may be utilized to insulate the component or to permit ready unloading. An aluminum bar 67 is used to provide strength and, possibly, electric shielding. Successive wafers are isolated by electromagnetic shields such as at 68, 69, and 70, FIG. 6, which may, of course, include adaptations such as depressions or protrusions for fitting to corresponding adaptations on the wafers. Such shields may be constructed, of course, by metallizing the surfaces of the elements such as 5*a* and 5*b*. Surfaces 76 and 77, for example, may be covered with a shielding material. The entire face of the wafer may be so covered. The embodiment shown in FIG. 6 may, of course, be constructed without any shielding whatsoever.

Figure 8:
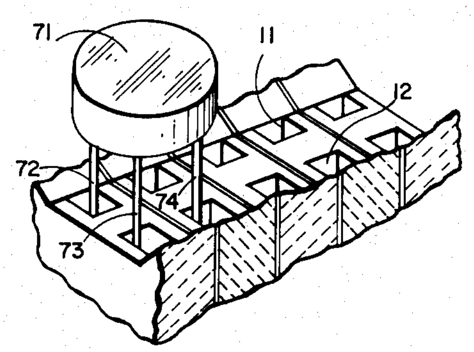
FIG. 8 is a view of successive wafer-like elements holding a single electrical component having several electrical connections.

It may be appreciated that three terminal or four terminal components, or even networks, (or even more terminals) may be held by the component holders. A three terminal network would make use of two successive locations on the holder. FIG. 8 illustrates a transistor 71, for example, in which two terminals 72 and 73 are held by one set of electrodes and terminal 74 would be held by one of the next component holding set of electrodes.

In the illustrations of FIG. 6 and 7, electrode contact may be made entirely from the bottom side of the stick. This is advantageous in simplicity of construction of equipment (such as electrical connection jigs) for making electrical contacts to the holder.

The device of the invention provides an electrical component package superior to known packages and affords maximum protection, ease of handling, and broad flexibility and adaptability to meet the needs of the situation, whether it be testing, storing, identifying, using, or otherwise.

Although the invention has been described and illustrated in detail, it is to be clearly understood that the same is by way of illustration and example only and is not to be taken by way of limitation, the spirit and scope of this invention being limited only by the terms of the appended claims.

We claim:

1. A device for holding electrical components comprising a body portion having a plurality of separate elements adapted to be bound together to form said body portion, said elements each comprising electrode means for making electrical contact to an electrical component, said electrode means comprising two spring electrodes adapted to receive, to hold, and to make electrical connections to, said electrical component and two further fixed electrodes adapted to make further connections to said electrical component in cooperation with said spring electrodes, each of said electrodes being insulated from the others except for the electrical path through the electrical connections to said electrical component.

2. A device for holding electrical components, said device comprising a body portion, a plurality of wafer-like elements comprising said body portion, said wafer elements adapted to be bound together in substantially fixed relationship, a plurality of groups of four electrodes for holding said electrical components in a rigid relationship, each group of electrodes held in fixed, spaced relationship by said elements, said electrodes cooperating in pairs and adapted to receive and make electrical contact to the electrical connections of electrical components, said electrical connections being unbent at the point thereof making electrical contact with said electrodes.

3. An electrical component holder comprising a series of wafer-like elements adapted to be bound together in substantially rigid, fixed relationship, each of said elements comprising two pairs of electrodes, one of said pairs of electrodes having a spring characteristic and adapted to cooperate with said remaining pair of electrodes to hold an electrical component by the electrical connectors therefore, said electrical connectors being unbent at the portion thereof held by said electrodes, said remaining pair of electrodes having a fixed flat portion and said pair of spring electrodes having a portion with an opening therethrough, which extends beyond said fixed electrodes' flat portion when flexed and which is parallel with and adjacent to said flat portion when unflexed, whereby said electrical component when inserted into said opening when said pair of spring electrodes is flexed is securely and rigidly held when said pair of spring electrodes is unflexed, said spring electrodes being adapted to release said electrical component upon said spring pair being flexed.

References Cited by the Examiner

UNITED STATES PATENTS

| | | | |
|---|---|---|---|
| 1,218,221 | 3/13 | Smith | 339—198 |
| 2,702,879 | 2/55 | Wheeler | 339—198 |
| 2,778,977 | 1/57 | Lubkin | 317—101 |
| 2,958,065 | 10/60 | Flanagan | 339—175 |

FOREIGN PATENTS

| | | |
|---|---|---|
| 547,198 | 8/42 | Great Britain. |

JOHN F. BURNS, *Primary Examiner.*